US009911610B2

(12) United States Patent
Konrath et al.

(10) Patent No.: US 9,911,610 B2
(45) Date of Patent: Mar. 6, 2018

(54) SEMICONDUCTOR DEVICE HAVING A METAL-SEMICONDUCTOR JUNCTION AND MANUFACTURING THEREFOR

(71) Applicant: Infineon Technologies AG, Neubiberg (DE)

(72) Inventors: Jens Peter Konrath, Villach (AT); Hans-Joachim Schulze, Taufkirchen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 14/969,663

(22) Filed: Dec. 15, 2015

(65) Prior Publication Data

US 2016/0189962 A1   Jun. 30, 2016

(30) Foreign Application Priority Data

Dec. 16, 2014 (DE) .................. 10 2014 118 768

(51) Int. Cl.
| | |
|---|---|
| H01L 21/04 | (2006.01) |
| H01L 21/78 | (2006.01) |
| H01L 21/285 | (2006.01) |
| H01L 29/16 | (2006.01) |
| H01L 29/47 | (2006.01) |
| H01L 29/78 | (2006.01) |
| H01L 29/872 | (2006.01) |
| H01L 21/265 | (2006.01) |
| H01L 29/06 | (2006.01) |

(Continued)

(52) U.S. Cl.
CPC .... *H01L 21/0495* (2013.01); *H01L 21/26513* (2013.01); *H01L 21/26526* (2013.01); *H01L 21/28537* (2013.01); *H01L 21/28581* (2013.01); *H01L 29/0619* (2013.01); *H01L 29/0634* (2013.01); *H01L 29/47* (2013.01); *H01L 29/475* (2013.01); *H01L 29/6606* (2013.01); *H01L 29/66212* (2013.01); *H01L 29/872* (2013.01); *H01L 21/0485* (2013.01); *H01L 29/1608* (2013.01); *H01L 29/2003* (2013.01)

(58) Field of Classification Search
CPC ................. H01L 27/115; H01L 29/792; H01L 27/11568; H01L 27/11521; H01L 27/105; H01L 21/26513; H01L 21/26526; H01L 21/28537; H01L 21/28581; H01L 29/0619; H01L 29/0634; H01L 29/47; H01L 29/475; H01L 29/6606; H01L 29/66212; H01L 29/872
See application file for complete search history.

(56) References Cited

U.S. PATENT DOCUMENTS

| | | | |
|---|---|---|---|
| 5,396,103 A | 3/1995 | Oiu et al. | |
| 6,404,261 B1 * | 6/2002 | Grover | H02J 7/0031 327/314 |

(Continued)

*Primary Examiner* — Marcos D Pizarro Crespo
*Assistant Examiner* — Long H Le
(74) *Attorney, Agent, or Firm* — Murphy, Bilak & Homiller, PLLC (57) ABSTRACT

A method for manufacturing a semiconductor device includes providing a wafer having a first semiconductor layer, forming at the first semiconductor layer a contact layer which includes a metallic chemical element, and implanting ions of a first chemical element different to the metallic chemical element into the contact layer.

18 Claims, 3 Drawing Sheets

(51) Int. Cl.
  *H01L 29/66* (2006.01)
  *H01L 29/20* (2006.01)

(56) References Cited

U.S. PATENT DOCUMENTS

| | | | |
|---|---|---|---|
| 2004/0084724 A1* | 5/2004 | Kapels | H01L 21/28512 |
| | | | 257/330 |
| 2005/0202661 A1* | 9/2005 | Ceruzzi | H01L 29/0615 |
| | | | 438/570 |
| 2007/0108547 A1* | 5/2007 | Zhu | H01L 21/28581 |
| | | | 257/471 |
| 2007/0241427 A1* | 10/2007 | Mochizuki | H01L 21/101 |
| | | | 257/586 |
| 2007/0278472 A1* | 12/2007 | Mauder | H01L 21/263 |
| | | | 257/11 |
| 2009/0140290 A1* | 6/2009 | Schulze | H01L 29/0692 |
| | | | 257/162 |
| 2012/0104537 A1* | 5/2012 | Schmidt | H01L 29/0638 |
| | | | 257/476 |
| 2012/0264259 A1* | 10/2012 | Hirler | H01L 21/82348 |
| | | | 438/123 |
| 2013/0023085 A1 | 1/2013 | Pramanik et al. | |

* cited by examiner

SEMICONDUCTOR DEVICE HAVING A METAL-SEMICONDUCTOR JUNCTION AND MANUFACTURING THEREFOR

PRIORITY CLAIM

This application claims priority to German Patent Application No. 10 2014 118 788.7 filed on 16 Dec. 2014, the content of said application incorporated herein by reference in its entirety.

TECHNICAL FIELD

Embodiments of the present invention relate to a semiconductor device with a metal-semiconductor junction and manufacturing methods therefor.

BACKGROUND

Metallic contacts at semiconductors are often used as highly conductive electrodes and or terminals in Ohmic contact with one or more semiconductor structures of a semiconductor body and as rectifying contacts forming Schottky-contacts with the semiconductor body.

Manufacturing of a metallic contact forming a metal-semiconductor junction with the semiconductor body is usually achieved by depositing a metal or an alloy on a surface of the semiconductor body, typically by sputtering or vapor coating (evaporating), and a subsequent thermal process which is often referred to as post deposition annealing (PDA).

However, the post deposition annealing may use comparatively high temperatures of typically at least 950° C. This may cause changes of already formed semiconductor structures, in particular Metal Oxide Semiconductor-structures (MOS-structures) such as MOSFET-structures (Metal Oxide Semiconductor Field Effect Transistor-structures) and IGBT-structures (Insulated Gate Bipolar Transistor-structures). Accordingly, manufacturing may be more complex and/or more expensive.

Further, several deposition steps with different targets may be required if metal contacts of a varying composition or if metal contacts of different compositions are desired. For example, a different metal composition may be required for forming an Ohmic metal-semiconductor contact with n-doped and p-doped semiconductor regions.

Accordingly, there is a need to improve manufacturing metal-semiconductor contacts and metal-semiconductor junctions, respectively.

SUMMARY

According to an embodiment of a method for manufacturing a semiconductor device, the method includes providing a wafer including a first semiconductor layer, forming at the first semiconductor layer a contact layer comprising a metallic chemical element, and implanting ions of a first chemical element different to the metallic chemical element into the contact layer.

According to an embodiment of a method for forming a metal contact on a semiconductor layer, the method includes forming a metal layer on the semiconductor layer so that the metal layer forms a metal-semiconductor junction with the semiconductor layer, and implanting first ions into the metal layer to alter a composition of at least a portion of the metal layer.

According to an embodiment of a semiconductor device, the semiconductor device includes a semiconductor body, and a metal layer forming a metal-semiconductor junction with the semiconductor body. The metal layer includes a mixture of elements including a metallic chemical element and a first chemical element different to the metallic chemical element. A composition of the mixture of elements varies in a vertical direction perpendicular to the metal-semiconductor junction.

Those skilled in the art will recognize additional features and advantages upon reading the following detailed description, and upon viewing the accompanying drawings.

BRIEF DESCRIPTION OF THE DRAWINGS

The components in the figures are not necessarily to scale, instead emphasis being placed upon illustrating the principles of the invention. Moreover, in the figures, like reference numerals designate corresponding parts. In the drawings.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Reference will now be made in detail to various embodiments, one or more examples of which are illustrated in the figures. Each example is provided by way of explanation, and is not meant as a limitation of the invention. For example, features illustrated or described as part of one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing steps have been designated by the same references in the different drawings if not stated otherwise.

The term "horizontal" as used in this specification intends to describe an orientation substantially parallel to a main side or a main surface of a semiconductor substrate or body. This can be for instance the upper or front side (surface) but also a lower or backside side (surface) of a wafer or a die. In the following, the main surface is also referred to as first surface.

The term "vertical" as used in this specification intends to describe an orientation which is substantially arranged perpendicular to the main side or the main surface, i.e. parallel to a normal direction of the main side or the main surface of the semiconductor substrate or body.

In this specification, a second surface of a semiconductor substrate of semiconductor body is considered to be formed by the lower or backside surface while the first surface is considered to be formed by the upper, front or main surface of the semiconductor substrate. The terms "above" and "below" as used in this specification therefore describe a relative location of a structural feature to another structural feature with consideration of this orientation.

In this specification, n-doped is referred to as first conductivity type while p-doped is referred to as second conductivity type. Alternatively, the semiconductor devices can be formed with opposite doping relations so that the first conductivity type can be p-doped and the second conductivity type can be n-doped. Furthermore, some Figures illustrate relative doping concentrations by indicating "−" or "+" next to the doping type. For example, "$n^-$" means a doping concentration which is less than the doping concentration of an "n"-doping region while an "$n^+$"-doping region has a larger doping concentration than the "n"-doping region. However, indicating the relative doping concentration does not mean that doping regions of the same relative doping concentration have to have the same absolute doping concentration unless otherwise stated. For example, two different $n^+$-doping regions can have different absolute doping concentrations. The same applies, for example, to an $n^+$-doping and a $p^+$-doping region.

Specific embodiments described in this specification pertain to, without being limited thereto, to semiconductor devices with metal contacts. Within this specification the terms "semiconductor device" and "semiconductor component" are used synonymously.

In the context of the present specification, the terms "metal layer" and "metal region" intends to describe a layer or a region with metallic or near metallic properties with respect to electric conductivity and made of and/or comprise a metallic chemical element such as Al, Ni, In, Ti, W, Cu, and Mo. A metal layer and a metal region, respectively, may be made of a substantially pure metal (metallic chemical element with a purity of a least 99.5%) or may be made of a mixture or compound of two or more metallic chemical elements such as an alloy and an intermetallic compound or may be made of a mixture or compound of one or more metallic chemical elements and one or more non-metallic elements such as Ge and Si. A metal layer (metal region) may be in contact with a semiconductor layer (region) to form an electrode, a pad and/or a terminal of the semiconductor device. A composition of a metal layer (metal region) may vary in a direction substantially parallel to a metal-semiconductor junction formed between the metal layer and a semiconductor layer or region.

In the context of the present specification, the term "metal-semiconductor junction" intends to describe the boundary surface between a metal layer or a metal region and an adjoining semiconductor layer or semiconductor region, i.e. semiconductor layer or semiconductor region which is in direct mechanical contact with the metal layer and the metal region, respectively. The metal-semiconductor junction may be a rectifying Schottky-junction or a non-rectifying junction.

In the context of the present specification, the terms "in ohmic contact", in resistive electric contact" and "in resistive electric connection" intend to describe that there is an ohmic current path between respective elements or portions of a semiconductor device at least when no voltages or only low testing voltages are applied to and/or across the semiconductor device. Likewise, the terms in low ohmic contact, "in low resistive electric contact" and "in low resistive electric connection" intend to describe that there is a low resistive ohmic current path between respective elements or portions of a semiconductor device at least when no voltages are applied to and/or across the semiconductor device. Within this specification the terms "in low ohmic contact", "in low resistive electric contact", "electrically coupled", and "in low resistive electric connection" are used synonymously.

In the context of the present specification, the term "pn-junction" as used in this specification intends to describe the boundary surface between adjoining semiconductor regions or semiconductor portions of different conductivity type.

The semiconductor device may be a power semiconductor device, e.g. a power diode with an anode and a cathode as power metallizations (electrodes) formed by respective metal layers each forming a metal-semiconductor junction with an anode semiconductor region and a cathode semiconductor region, respectively, or a power transistor with two power metallizations forming respective metal-semiconductor junctions with an npn-semiconductor transistor structure or a pnp-semiconductor transistor structure (e.g. source metallization and drain metallization in embodiments referring to MOSFETs or emitter metallization and collector metallization in embodiments referring to IGBTs and bipolar transistors) and a control metallization which is isolated from the semiconductor transistor structure in embodiments referring to MOSFETs and IGBTs and forms a metal-semiconductor junction with a base region in embodiments referring to bipolar transistors, respectively.

The term "power semiconductor device" as used in this specification intends to describe a semiconductor device on a single chip with high voltage and/or high current switching capabilities. In other words, power semiconductor devices are intended for high current, typically in the Ampere range and/or blocking voltages of more than about 10 V or 100 V, or even more than about 1000 V or about 3300 V. Within this specification the terms "power semiconductor device" and "power semiconductor component" are used synonymously.

The term "field-effect" as used in this specification intends to describe the electric-field mediated formation of a conductive "channel" of a first conductivity type and/or control of conductivity and/or shape of the channel in a semiconductor region of a second conductivity type, typically a body region of the second conductivity type. Due to the field-effect, a unipolar current path through the channel region is formed and/or controlled between a source region of the first conductivity type and a drift region of the first conductivity type. The drift region may be in contact with a drain region. The drift region and the drain region are in low Ohmic contact with a drain electrode (drain metallization). The source region is in low Ohmic contact with a source electrode (source metallization).

In the context of the present specification, the term "MOS" (metal-oxide-semiconductor) should be understood as including the more general term "MIS" (metal-insulator-semiconductor). For example, the term MOSFET (metal-oxide-semiconductor field-effect transistor) should be understood to include FETs having a gate insulator that is not an oxide, i.e. the term MOSFET is used in the more general term meaning of IGFET (insulated-gate field-effect transistor) and MISFET (metal-insulator-semiconductor field-effect transistor), respectively. The term "metal" for the gate material of the MOSFET should be understood to include or comprise electrical conductive materials like e. g. metal, alloys, doped polycrystalline semiconductors and metal semiconductor compounds like metal silicides.

In the following, embodiments pertaining to semiconductor devices and manufacturing methods for forming semiconductor devices are explained mainly with reference to silicon carbide (SiC) semiconductor devices. Accordingly, a monocrystalline semiconductor region or layer is typically a monocrystalline SiC-region or SiC-layer. It should, however, be understood that the semiconductor body can be made of any semiconductor material suitable for manufacturing a semiconductor device. Examples of such materials include, without being limited thereto, elementary semiconductor materials such as silicon (Si) or germanium (Ge), group IV compound semiconductor materials such as silicon carbide (SiC) or silicon germanium (SiGe), binary, ternary or quaternary III-V semiconductor materials such as gallium nitride (GaN), gallium arsenide (GaAs), gallium phosphide (GaP), indium phosphide (InP), indium gallium phosphide (InGaPa), aluminum gallium nitride (AlGaN), aluminum indium nitride (AlInN), indium gallium nitride (InGaN), aluminum gallium indium nitride (AlGaInN) or indium gallium arsenide phosphide (InGaAsP), and binary or ternary II-VI semiconductor materials such as cadmium telluride (CdTe) and mercury cadmium telluride (HgCdTe) to name few. The above mentioned semiconductor materials are also referred to as homojunction semiconductor materials. When combining two different semiconductor materials a heterojunction semiconductor material is formed. Examples of heterojunction semiconductor materials include, without being limited thereto, aluminum gallium nitride (AlGaN)-aluminum gallium indium nitride (AlGaInN), indium gallium nitride (InGaN)-aluminum gallium indium nitride (AlGaInN), indium gallium nitride (InGaN)-gallium nitride (GaN), aluminum gallium nitride (AlGaN)-gallium nitride (GaN), indium gallium nitride (InGaN)-aluminum gallium nitride (AlGaN), silicon-silicon carbide ($Si_xC_{1-x}$) and silicon-SiGe heterojunction semiconductor materials. For power semiconductor applications currently mainly Si, SiC, GaAs and GaN materials are used. If the semiconductor body comprises a high band-gap material, i.e. a semiconductor material with a band-gap above 1 eV such as SiC or GaN which has a high breakdown field strength and high critical avalanche field strength, respectively, the doping of the respective semiconductor regions can be chosen higher which reduces the on-state resistance Ron in the following also referred to as on-resistance Ron.

Figure 1A:
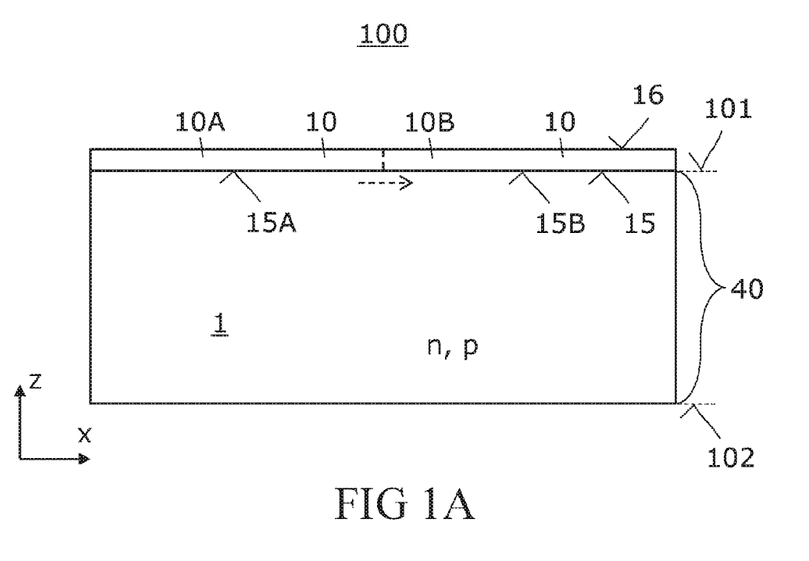
FIG. 1A illustrates a vertical cross-section through a semiconductor device according to an embodiment.
Figure 2A:
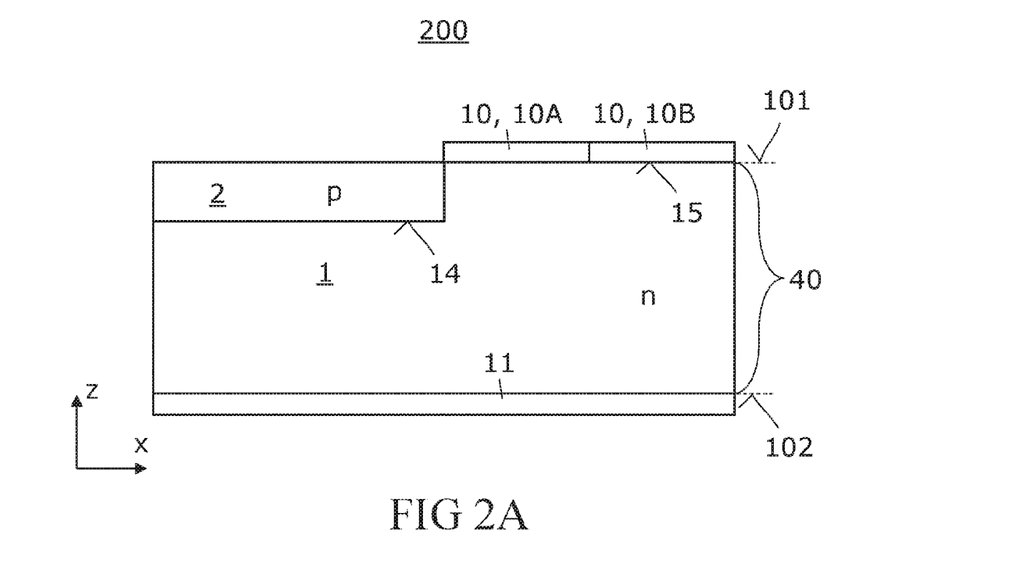
FIG. 2A illustrates a vertical cross-section through a semiconductor device according to an embodiment.
Figure 2B:
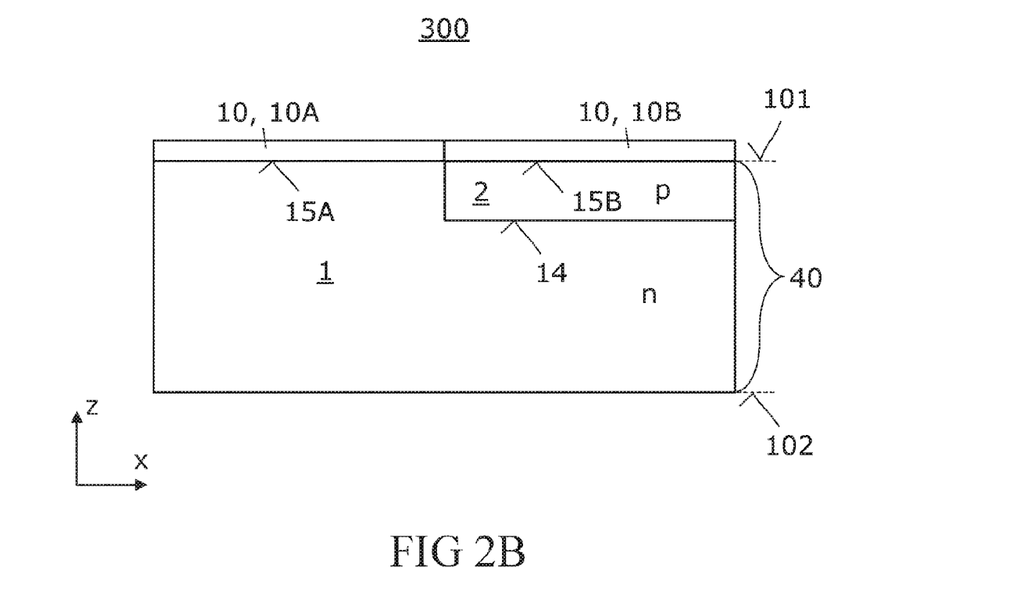
FIG. 2B illustrates a vertical cross-section through a semiconductor device according to an embodiment.

With reference to FIGS. 1A and 2B, a semiconductor device 100 is explained. FIG. 1A illustrates a section of a vertical cross-section through a semiconductor body 40 of the semiconductor device 100. The semiconductor body 40 extends between a first surface 101, facing a vertical direction z, and a second surface (back surface) 102 arranged opposite to the first surface 101.

In the exemplary embodiment, only one semiconductor layer 1 is shown in FIG. 1A. Depending on the device type and/or voltage class, the semiconductor device 100 may include several semiconductor layers and/or several semiconductor regions.

The semiconductor body 40 may include a bulk monocrystalline material and at least one epitaxial layer formed thereon. Using the epitaxial layer(s) provides more freedom in tailoring the background doping of the material since the doping concentration can be adjusted during deposition of the epitaxial layer or layers.

A metal layer 10 forming a metal-semiconductor junction 15 with the semiconductor body 40 and the semiconductor layer 1, respectively, is arranged on and at the first surface 101. in the following, the metal layer 10 is also referred to as contact layer 10.

Depending on the device type and/or voltage class, the semiconductor device 100 may include one or more further metal layers or metal regions (not shown) each of which forms a respective metal-semiconductor junction with the semiconductor body 40. For example, the semiconductor device 100 may have, in embodiments referring to vertical semiconductor devices such as vertical MOSFETs and vertical IGBTs, a further metal layer (not shown) formed at the back surface 102. In embodiments referring to lateral semiconductor devices, the semiconductor device 100 may have a further metal layer (not shown) formed at the first surface 101, typically in another section (not shown).

In the exemplary embodiment, the metal layer 10 has a first portion 10A and a second portion 10B which differ in composition. Accordingly, the composition of the metal layer 10 varies in the horizontal direction x step-wise on a path at and typically also above the metal-semiconductor junction 15. In other embodiments, the composition of the metal layer 10 varies in x-direction continuously.

Due to the varying composition of the metal layer 10 at and close to the metal-semiconductor junction 15, the electric properties of the metal-semiconductor junction 15 typically also varies step-wise or continuously in horizontal direction.

For example, a first portion 15A of the metal-semiconductor junction 15 formed between the first portion 10A of the metal layer 10 and the semiconductor layer 1 may be non-rectifying (have Ohmic characteristics) and a second portion 15B of the metal-semiconductor junction 15 formed between the first portion 10A of the metal layer 10 and the semiconductor layer 1 may be a rectifying Schottky-junction.

In one embodiment, the first portion 10A of the metal layer 10 is made of a pure (or substantially pure) metal (metallic chemical element) such as titanium (Ti) or nickel (Ni) and the second portion 10B of the metal layer 10 is an alloy (intermetallic compound) made of the metallic chemical element and one or more further chemical elements such as aluminum (Al).

Due to the manufacturing using ion implanting as explained below with regard to FIG. 3A to FIG. 3C, the composition of the second portion 10B of the metal layer 10 typically varies in z-direction, i.e. in a vertical direction perpendicular to the metal-semiconductor junction 15. This is illustrated in FIG. 1B corresponding to an embodiment in which the first portion 10A is made of nickel and the second portion 10B is made of a NiAl alloy formed by masked implanting of aluminium ions from top and first side 101, respectively.

Figure 1B:
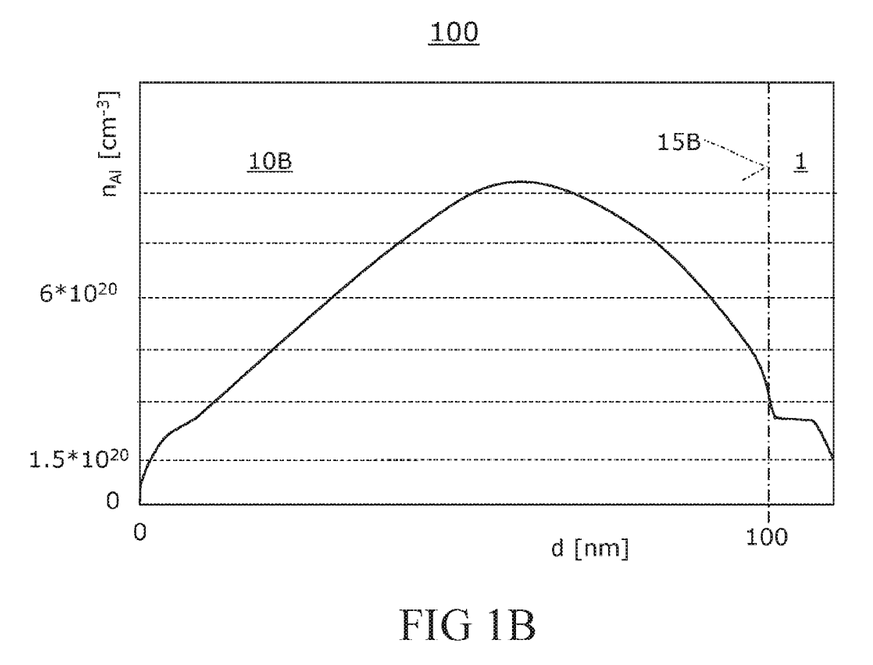
FIG. 1B illustrates a vertical concentration profile of the semiconductor device illustrated in FIG. 1A according to an embodiment.

FIG. 1B shows the concentration $n_{Al}$ of aluminium along a vertical line crossing the second portion 15B of the metal-semiconductor junction 15 in FIG. 1A. The concentration $n_{Al}$ was obtained after implanting Al-ions of 100 keV with a dose of 7.5 $10^{15}$ cm$^{-2}$ on a 100 nm thick Ni-layer formed on a SiC-layer 1. The peak (maximum) concentration of aluminum in FIG. 1B corresponds to about 1% aluminum in the binary NiAl-alloy.

The vertical concentration profile can be adjusted by implanting dose and implanting energy.

Furthermore, several implantations of different energy may be used.

Accordingly, the concentration of aluminum (first chemical element) may have as function of vertical co-ordinate z several peaks within the metal layer 10 instead of the single peak shown in FIG. 1B.

Even further, different ions may be implanted to form a tertiary or even higher alloy.

As illustrated in FIG. 1B, a portion of the Al-ions may cross the portion 10B and reach the semiconductor layer 1 where they may form point defects, in particular impurity interstitials that may act as acceptors. In this way, a shallow p-doped region may be formed in an n-doped semiconductor layer 1 made of Si or SiC.

For this purpose, a maximum concentration of aluminum or indium is typically larger than about $10^{20}$ cm$^{-3}$, more typically larger than about $2*10^{20}$ cm$^{-3}$ in the semiconductor body 40 at and typically also next to the metal-semiconductor junction 15, for example within 5 nm or 10 nm from the metal-semiconductor junction 15.

Depending on implantation energy and dose, the point defects may extend into the semiconductor layer 1 up to a depth of about 5 nm, 10 nm, 20 nm or even more.

Alternatively or in addition, the so-called recoil-effect resulting in pushing ions of the irradiated metal layer into the adjoining semiconductor layer or region may be used for doping a portion the semiconductor layer 1 during forming the alloy at the semiconductor layer 1.

For example, an aluminium or indium layer deposited on a silicon layer may be irradiated with nickel ions of sufficient implanting energy so that aluminium or indium ions are pushed from the metal layer info the silicon layer where they may act as donors.

The point defects resulting formed by recoiled ions may only extend into the semiconductor layer 1 up to a depth of about 1 nm.

In other embodiments, titanium, cobalt, chromium, platinum, aluminum, indium, carbon or germanium ions may be used for irradiating a nickel or titanium layer.

Typically, the metal layer 10 includes a mixture of elements including a metallic chemical element and a first chemical element different to the metallic chemical element, for example another metallic chemical element or a semiconducting chemical element.

The term "mixture of elements" as used within this specification intends to describe a substance made of two or more chemical elements mixed with each other, that is solid at room temperature and can be formed by physical means, in particular by implantation ions of one or more chemical element into a metal and a subsequent optional thermal process at a temperature of at most about 400° C. after implanting. Furthermore, the mixture of elements can typically also be separated by physical means such as melting and evaporation. (*Kommentar: in Engl, wird zwischen einer chernischen Verbindung und einer durch phys. Methoden herstellbaren Legierung unterschieder*)

Typically, the mixture is an alloy.

For SiC-devices, the metal layer 10 typically includes a NiAl-alloy, a TiAl-alloy, a NiCr-alloy, or a NiPt-alloy, for example as a portion 10B of the metal layer 10.

The vertical thickness of the metal layer 10 may be in a range from about 10 nm to about 1 μm, more typically in a range from about 25 nm to about 250 nm, even more typically in a range from about 75 nm to about 150 nm.

FIG. 2A illustrates a section of a vertical cross-section through a semiconductor body 40 of a semiconductor device 200. The semiconductor device 200 is similar to the semiconductor device 100 explained above with regard to FIG. 1A and FIG. 1B and also includes metal layer 10 with two portions 10A, 10B.

The semiconductor device 200 may be a vertical Schottky-diode with an anode formed by the metal layer 10 and a cathode metallization 11 arranged opposite and in Ohmic contact with the first semiconductor layer 1.

In one embodiment, the semiconductor device 200 is implemented as a so-called vertical MPS-diode (Merged PiN Schottky diode).

In the exemplary embodiment, the height of the Schottky-barrier of the metal-semiconductor junction 15 is, compared to the second portion 10B, lower in the first portion 10A, which is arranged next to and in horizontal direction between the second portion 10B and a p-doped region 2 forming a pn-junction 14 with the first semiconductor layer 1.

In other embodiments, the composition of the metal layer 10 varies continuously in the horizontal direction (x-direction) so that the Schottky-barrier in the vicinity of the p-doped region 2 is lower than in the more remote areas in order to improve the trade-off between forward voltage drop and leakage current by using the shielding-effect of the p-doped region(s) 2 during a blocking mode of the Schottky-diode.

Note that Schottky-diodes have a very low amount of stored charges, a low the threshold voltage and a low on-state resistance Ron (forward voltage drop), and are often used in high frequency applications. Due to the unipolar character (i.e. no bipolar injection), the avalanche stability, the surge current stability of Schottky diodes is however limited, in MPS-diodes, the Schottky contacts alternate with pn-junctions 14 connected in parallel. Accordingly, FIG. 2A typically corresponds to one of a plurality of unit cells of the MPS-diode 200.

Furthermore, the p-doped region 2 may be in Ohmic contact with the metal layer 10. The metal layer 10 may have a further portion (not shown) adjoining the p-doped region 2, for example made of a substantially pure metal. The metal layer 10 may even completely cover the first surface 101 in an active area including the unit cells.

The pn-junctions 14 of the MPS-diode 200 protect the Schottky contacts 15 during the off-state (i.e. during reverse biasing of the pn-junctions 14 and the Schottky contacts 15). Furthermore, the pn-junctions 14 contribute to the forward current above a threshold voltage drop of, for example 3 V, for silicon carbide (SiC) MPS-diodes. Accordingly, MPS-diodes can carry higher forward currents and have a better avalanche stability and a lower leakage current than Schottky diodes.

The variation of the composition in horizontal x-direction of the metal layer 10 may be achieved by suitable horizontal variation of ion implantation, for example, using a masking technique and (multiple) ion implantation(s).

FIG. 2B illustrates a section of a vertical cross-section through a semiconductor body 40 of a semiconductor device 300. The semiconductor device 300 is similar to the semiconductor device 200 explained above with regard to FIG. 2A and also includes a metal layer 10 having a composition that varies continuously or step-wise (has two portions 10A, 10B of different composition at same distance from the metal-semiconductor junction 15) on a path at and/or parallel to the metal-semiconductor junction 15.

The semiconductor device 300 has a so-called butting contact, i.e. a short-circuited n-p-contact (Ohmic contact to an n-doped and a p-doped semiconductor region), often used in semiconductor devices for example compensation-MOSFETs (also known as CoolMOS-devices).

In the exemplary embodiment, the metal layer 10 has at the first surface a first portion 10A in Ohmic contact with an adjoining n-type first semiconductor layer 1 and a second portion 10B adjoining the first portion 10A and a p-type semiconductor region 2 forming a pn-junction 14 with the first semiconductor layer 1.

Typically, the pn-junction 14 extends to the first surface 101 and the metal layer 10, respectively.

In embodiments referring to SiC-devices, the first portion 10A and the second portion 10B may, for example, be formed by a NiAl-alloy with higher concentration of aluminum in the first portion 10A.

Figure 3A:
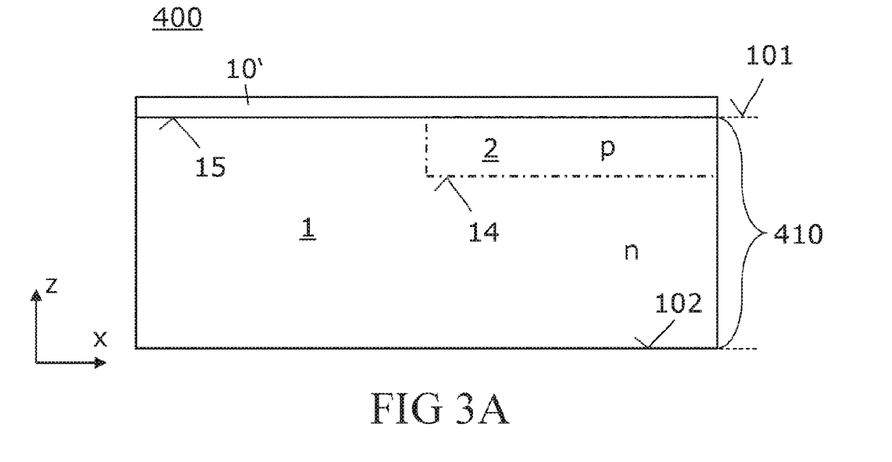
FIG. 3A to FIG. 3C illustrate vertical cross-sections through a semiconductor wafer during method steps of a method according to embodiments.
Figure 3B:
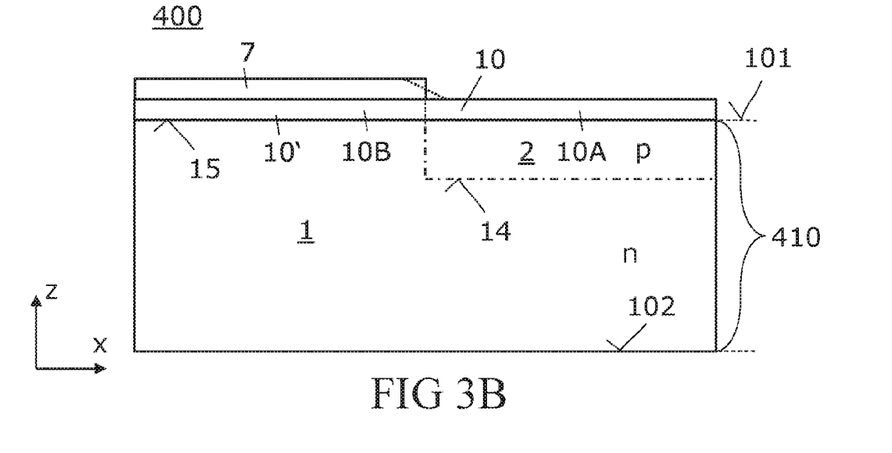
Figure 3C:
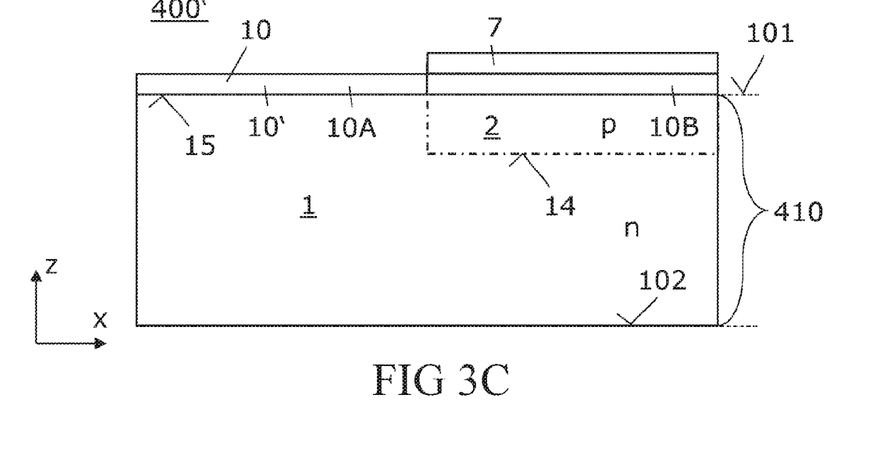

With regard to FIG. 3A to FIG. 3C method steps of a method for manufacturing a semiconductor device 400 having a metal contact are explained.

In a first step, a wafer 410 having a first side or surface 101 and a first semiconductor layer 1, which is n-type and extends to the first side 101 in the exemplary embodiment, is provided.

The wafer 410 may, for example, be a SiC-wafer, a GaN-wafer or a Si-wafer.

Thereafter, a contact layer 10' made of a metal or an alloy is formed on and at the first semiconductor layer 1, for example by deposition, sputtering or vapor coating (evaporating).

Accordingly, the contact layer 10' includes one or more metallic chemical elements with a substantially non-varying composition, i.e. at least when averaged over a volume larger than a grain size of the contact layer 10', for example a composition isotropic on nm-scale.

For example, the contact layer 10' may be made of nickel or titanium.

A vertical thickness of the contact layer 10' may be in a range from about 10 nm to about 1 µm, more typically in a range from about 25 nm to about 250 nm, even more typically in a range from about 75 nm to about 150 nm.

The contact layer 10' is typically formed mask-less at the first semiconductor layer 1 and may completely cover the first side 101 as illustrated in FIG. 3A.

Thereafter, an implantation mask 7 may be formed on and at the contact layer 10'. The resulting structure 400 is illustrated in FIG. 3B.

As indicated by the dashed-dotted rectangle, a p-type region 2, for example an anode region 2 may be formed in the wafer 410 prior to forming the implantation mask 7, which is in the following also referred to as mask 7.

The mask 7 may have opening(s) above the p-type region(s) 2 as illustrated in FIG. 3B or may cover the p-type region(s) 2 and have openings next to the p-type region(s) 2 as illustrated in FIG. 3C showing a wafer-structure 400'.

Typically, the mask 7 has openings above and at first portions 10A of the contact layer 10' and covers second portions 10B of the contact layer 10' to at least substantially reduce the amount of ions that are later implanted into the covered second portions 10B of the contact layer 10'.

Depending on the semiconductor device to be manufactured, one or more diode-structures and/or one or more bipolar transistor-structures or the like may be formed in the wafer 410 prior to forming the implantation mask 7.

Furthermore, one or more insulated gate electrode structures each including a gate electrode and a gate dielectric arranged between the gate electrode and the wafer 410 may be formed next the first side 101 prior to forming the implantation mask 7.

The gate electrode(s) may be formed as lateral gate electrode(s) arranged on the first side or as trench gate electrode(s) arranged in trenches extending from the first side into the wafer 410.

After forming the mask 7, ions of a first chemical element (first ions) different to the metallic chemical element(s) of the contact layer 10' may be implanted from the first side 101 into the contact layer 10'.

In embodiments referring to nickel or titanium layers 10', ions of aluminum, indium, titanium, cobalt, chromium, tantalum, platinum, palladium, carbon or germanium may be implanted into the metal layer 10'.

The thickness of the mask 7 and the implantation energy may be chosen such that almost none or only a small fraction (e.g. less than 1%) of ions reach the second portions 10B of the contact layer 10'.

For example, a resist layer having a vertical thickness of at least about 1500 nm may be used as implantation mask to shield the second portion 10B against Al-ions with an energy of about 100 k eV (kilo electron volts).

Typically, a large fraction of ions, typically at least 50%, more typically at least 80% or even at least 90% of ions reaching the upper surface of the first portions 10B of the contact layer 10' are integrated into the first portions 10B. A vertical concentration profile of the implanted ions may have its maximum in the first portions 10B, for example at a distance ranging from about 10 nm to about 40 nm from the metal-semiconductor junction 15.

Accordingly, a metal layer 10, typically an alloy with a composition varying both in vertical direction and horizontal direction is formed.

A small fraction of ions reaching the upper surface of the first portions 10B of the contact layer 10' may even reach the first semiconductor layer 1 and may eventually form donors in shallow portions 2 of the first semiconductor layer 1 forming a shallow p-doped regions 2 as explained above with regard to FIG. 1B.

Alternatively or in addition, the implantation energy may be chosen such that ions of the deposited contact layer 10' are pushed in the shallow portions 2 using the recoil-effect.

Typically, the ions are implanted with an energy of at least about 30 k eV, more typically of at least about 50 k eV, and even more typically of at least about 100 k eV.

Furthermore, ions are typically implanted with a dose of at least about $10^{13}$ cm$^{-2}$ times the thickness of the contact layer 10' measured in nm are typically used.

Accordingly, an electric property (e.g. a Schottky-barrier height) of the metal-semiconductor junction 15 is sufficiently altered in horizontal direction.

As indicated by the dotted line in FIG. 3B, the sidewall of the mask 7 may be tapered to achieve a smoother horizontal variation of the implanted ions and the composition of the metal layer 10, respectively.

Further, several implantations with ions of different energy and/or dose may be used.

Furthermore, two or more implantations from the first side 101 with ions of different chemical elements (e.g. second ions and/or third ions of chemical elements different to each other, the first chemical element, and the metallic chemical element(s) of the contact layer 10') may be used. Typically, these ions are also implanted with an energy of at least about 30 k eV, more typically of at least about 50 k eV, and even more typically of at least about 100 k eV, and/or with a dose of at least about $10^{13}$ cm$^{-2}$ times the thickness of the contact layer 10' measured in nm.

Thereafter, a thermal process at a temperature of at most about 400° C., e.g. typically in a temperature range from about 350° C. to about 390° C. may be used to form a thermodynamic stable phase. The thermal process may last for about half an hour to about two hours.

Alternatively or in addition a short laser treatment (laser pulses) may be used to (partly) melt the metal layer 10, thereby altering the vertical concentration profile the metal layer 10. This is typically done so that the semiconductor material of the wafer 410 is not heated above about 400° C.

Due to using thermal process with only a low thermal budget, semiconductor structures formed prior to the metal layer 10 are not altered. This facilitates manufacturing.

Furthermore, the required fine-structuring of e.g. NiAl-contacts formed by depositions of different alloys ant lift-off processes and the used annealing step can be omitted. Accordingly, the describe method based on implantation allows a simpler and less expensive manufacturing of metal contacts with horizontally varying electric properties.

Thereafter, the wafer 410 may be separated, e.g. by sawing along sawing lines, into individual semiconductor devices as explained above with regard to FIG. 1A to FIG. 2B having a semiconductor body 40 formed by portions of the wafer 410.

The method explained with regard to FIG. 3A to 3C may also be described as a method for forming a metal contact on a semiconductor layer 1 which includes forming a metal layer 10' on the semiconductor layer 1 so that the metal layer 10' forms a metal-semiconductor junction 15 with the semiconductor layer 1; and implanting first ions into the metal layer 10' to alter a composition of at least a portion 10B of the metal layer 10', i.e. to change or transform at least a part of the metal layer 10' into an alloy 10A, 10B.

The method is typically performed such that a composition of the metal layer varies continuously or step-wise on a path at the metal-semiconductor junction 15.

Further, the method may include a thermal process at a temperature of at most about 400° C. after implanting; implanting second ions different to the first ions info the metal layer 10', and forming at least one of a diode-structure and a transistor-structure below a first surface 101 of the semiconductor layer 1 prior to forming the metal layer 10'.

In one embodiment, the manufactured semiconductor device includes a semiconductor body 40, and a metal layer 10 forming a metal-semiconductor junction 15 with the semiconductor body 40 wherein the metal layer 10 includes two metallic chemical elements, and wherein the semiconductor body 40 includes point defects formed by at least one of the two metallic chemical elements.

The point defects typically form impurity interstitials in the semiconductor material at and/or next metal-semiconductor junction 15.

Typically, a composition of the metal layer 10 varies continuously or step-wise on a path at and/or close to the metal-semiconductor junction 15.

In an embodiment, the semiconductor device includes a semiconductor body, and a metal layer forming a metal-semiconductor junction with the semiconductor body. The metal layer includes a mixture of elements including a metallic chemical element and a first chemical element different to the metallic chemical element. A composition of the mixture of elements varies in a vertical direction perpendicular to the metal-semiconductor junction.

Although various exemplary embodiments of the invention have been disclosed, it will be apparent to those skilled in the art that various changes and modifications can be made which will achieve some of the advantages of the invention without departing from the spirit and scope of the invention, it will be obvious to those reasonably skilled in the art that other components performing the same functions may be suitably substituted. It should be mentioned that features explained with reference to a specific figure may be combined with features of other figures, even in those cases in which this has not explicitly been mentioned. Such modifications to the inventive concept are intended to be covered by the appended claims.

Spatially relative terms such as "under", "below", "lower", "over", "upper" and the like are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings, instead, the present invention is limited only by the following claims and their legal equivalents.

The invention claimed is:

1. A method for manufacturing a semiconductor device, the method comprising:
   providing a wafer comprising a first semiconductor layer;
   forming at the first semiconductor layer a contact layer comprising a metallic chemical element;
   forming a mask on the contact layer; and
   implanting more ions of a first chemical element into a first part of the contact layer uncovered by the mask and implanting fewer of the ions of the first chemical element into a second part of the contact layer covered by the mask.

2. The method of claim 1, further comprising at least one of:
   a thermal process at a temperature of at most about 400° C. after implanting the ions of the first chemical element;
   masked etching of the contact layer; and
   separating the wafer into individual chips.

3. The method of claim 1, further comprising a laser treatment of the contact layer after implanting the ions of the first chemical element.

4. The method of claim 1, wherein the ions of the first chemical element are implanted with an energy of at least about 30 keV.

5. The method of claim 1, wherein the ions of the first chemical element are implanted with a dose of at least about $10^{13}$ cm$^{-2}$ times a thickness of the contact layer.

6. The method of claim 1, wherein implanting the ions is performed such that at least part of the ions of the first chemical element reach the first semiconductor layer.

7. The method of claim 1, further comprising, prior to forming the contact layer, at least one of:
forming a diode-structure in the wafer;
forming a transistor-structure in the wafer; and
forming an insulated gate electrode next to a first side of the wafer.

8. The method of claim 1, wherein the first semiconductor layer comprises silicon, silicon carbide or gallium nitride, wherein the contact layer comprises nickel or titanium, and/or wherein the chemical element is aluminum, indium, titanium, cobalt, chromium, tantalum, platinum, palladium, carbon or germanium.

9. The method of claim 1, further comprising implanting ions of a second chemical element different to the metallic chemical element and the first chemical element into the contact layer and/or the first semiconductor layer.

10. The method of claim 1, wherein forming the contact layer comprises sputtering and/or vapor coating.

11. The method of claim 1, wherein less than 1% of the ions of the first chemical element reach the second part of the contact layer covered by the mask.

12. The method of claim 1, wherein the ions of the first chemical element are implanted into the contact layer to vary an alloy composition of the contact layer both in a vertical direction and a horizontal direction.

13. A method for forming a metal contact on a semiconductor layer, the method comprising:
forming a metal layer on the semiconductor layer so that the metal layer forms a metal-semiconductor junction with the semiconductor layer;
implanting first ions into the metal layer to alter a composition of at least a portion of the metal layer;
performing a thermal process at a temperature of at most about 400° C. after implanting the ions of the first chemical element;
implanting second ions different to the first ions into the metal layer; and
forming at least one of a diode-structure and a transistor-structure below a first surface of the semiconductor layer prior to forming the metal layer.

14. The method of claim 13, wherein a composition of the metal layer varies continuously or step-wise on a path at the metal-semiconductor junction.

15. The method of claim 13, further comprising forming a mask on the metal layer prior to implanting the first ions into the metal layer.

16. The method of claim 15, wherein implanting the first ions into the metal layer comprises:
implanting more of the first ions into a first part of the metal layer uncovered by the mask and implanting fewer of the first ions into a second part of the metal layer covered by the mask.

17. The method of claim 13, wherein the first ions are implanted into the metal layer to alter the composition both in a vertical direction and a horizontal direction.

18. A method for manufacturing a semiconductor device, the method comprising:
providing a wafer comprising a first semiconductor layer;
forming at the first semiconductor layer a contact layer comprising a metallic chemical element;
implanting ions of a first chemical element different to the metallic chemical element into the contact layer;
performing a thermal process at a temperature of at most about 400° C. after implanting the ions of the first chemical element;
masked etching of the contact layer; and
separating the wafer into individual chips.

* * * * *